United States Patent [19]

Hiraoka et al.

[11] Patent Number: 5,509,078
[45] Date of Patent: Apr. 16, 1996

[54] CIRCUIT FOR PREVENTING CROSSTALK

[75] Inventors: Haruo Hiraoka; Kazuaki Sugawara, both of Tokyo, Japan

[73] Assignee: Pioneer Electronic Corporation, Tokyo, Japan

[21] Appl. No.: 6,689

[22] Filed: Jan. 21, 1993

Related U.S. Application Data

[63] Continuation of Ser. No. 572,276, Aug. 24, 1990, abandoned.

[30] Foreign Application Priority Data

Mar. 15, 1990 [JP] Japan ................... 2-26535 U

[51] Int. Cl.$^6$ ........................................ H04S 1/00
[52] U.S. Cl. .................. 381/1; 381/94; 381/28; 330/149; 330/151; 330/124 R; 330/29 S
[58] Field of Search ................... 381/1, 28, 94; 330/149, 151, 124 R, 298

[56] References Cited

U.S. PATENT DOCUMENTS

| | | | |
|---|---|---|---|
| 3,026,378 | 3/1962 | Fine et al. ........................ | 381/28 |
| 4,118,599 | 10/1978 | Iwahara et al. ........................ | 381/1 |
| 4,192,969 | 3/1980 | Iwahara ........................ | 381/1 |
| 4,524,452 | 6/1985 | Marshak ........................ | 381/28 |
| 4,700,389 | 10/1987 | Nakayama ........................ | 381/1 |
| 4,980,914 | 12/1990 | Kunugi et al. ........................ | 381/63 |

FOREIGN PATENT DOCUMENTS

| | | | |
|---|---|---|---|
| 2640254 | 3/1978 | Germany ........................ | 381/1 |
| 019400 | 1/1985 | Japan ........................ | 381/1 |

*Primary Examiner*—Forester W. Isen
*Attorney, Agent, or Firm*—Nikaido, Marmelstein, Murray & Oram

[57] ABSTRACT

An operational amplifier is applied with an audio signal at a non-inverting terminal thereof for amplifying the audio signal. A crosstalk cancelling circuit is provided for reducing the output of the operational amplifier to a level of crosstalk generated at the non-inverting terminal. The output of the crosstalk cancelling circuit is applied to an inverting terminal of the operational amplifier so as to cancel the crosstalk.

6 Claims, 5 Drawing Sheets

CIRCUIT FOR PREVENTING CROSSTALK

This application is a continuation of application Ser. No. 572,276 filed Aug. 24, 1990.

BACKGROUND OF THE INVENTION

The present invention relates to a circuit for preventing crosstalk between adjacent circuits such as acoustic circuits.

Heretofore, various circuits have been proposed for preventing reduction of sound quality caused by crosstalk.

One of the methods for preventing crosstalk is reduction of the length of a signal line. A long signal line causes stray capacitance to increase, which may generate crosstalk, causing distortion of an audio signal.

FIG. 5 shows a conventional audio amplifier. The audio amplifier has operational amplifier OP1 for the left stereo channel and operational amplifier (hereinafter called opamp) OP2 for the right stereo channel. The non-inverting terminal of opamp OP1 is connected to input terminal Li of the left stereo channel (hereinafter called L-channel) through variable resistor VR1 and source changeover switch SW1. The inverting terminal of opamp OP2 is connected to gain setting resistors Ra1 and Rb1 and the other end of Rb1 is connected to an intermediate point between voltage dividing resistors R1 and R2.

The non-inverting terminal of opamp OP2 is connected to input terminal Ri of the right stereo channel (hereinafter called R-channel) through a variable resistor VR2 and a source changeover switch SW2. The inverting terminal of the opamp OP2 is connected to a gain setting resistors Ra2 and Rb2 and the other end of Rb2 is connected to a voltage divider comprising the resistors R1 and R2.

Audio signals from the input terminal Li and Ri are amplified by opamps OP1 and OP2 and output from output terminals Lo and Ro.

In such an audio amplifier, stray capacities generate, for example stray capacitance C1 and C2 between the output terminal Ro and a point a and between the output terminal Lo and a point b. Consequently, crosstalk is generated between the output terminal Lo and Ro. The crosstalk generated is remarkably when a high frequency signal is included in the audio signal. The crosstalk reduces the sound quality of the output sound.

SUMMARY OF THE INVENTION

An object of the present invention is to provide a circuit which may prevent generation of the crosstalk, whereby ensuring the quality of output sound.

Another object of the present invention is to provide a circuit for preventing the crosstalk comprising a first and second input terminal devices for receiving a first signal and a second signal respectively, a first operational amplifier having a first input terminal and a second input terminal, the first input terminal being electrically connected to the first input terminal device, a crosstalk cancelling circuit provided between the second input terminal device and the second input terminal for applying a component of the second signal to the second input terminal thereby cancelling crosstalk generating between the first input terminal device and the first input terminal.

The circuit further comprises a second operational amplifier connected to second input terminal device, and the crosstalk cancelling circuit is provided between an output terminal of the second operational amplifier and the second input terminal of the first operational amplifier, and the crosstalk cancelling circuit comprises an attenuator for reducing the output of the second operational amplifier.

In an aspect of the invention, the crosstalk cancelling circuit has an amplifier for amplifying the second signal so as to cancel the crosstalk.

In further aspect of the invention, there is provided a plurality of signal sources, and a plurality of crosstalk cancelling circuits for amplifying input signals from the signal sources respectively. A plurality of select switches are provided for selecting one of the sources as an input signal for the first operational amplifier and for selecting one of the crosstalk cancelling circuit connected to another source than the selected source.

The other objects and features of this invention will become understood from the following description with reference to the accompanying drawings.

DETAILED DESCRIPTION OF THE PREFERRED EMBODIMENTS

Figure 1:
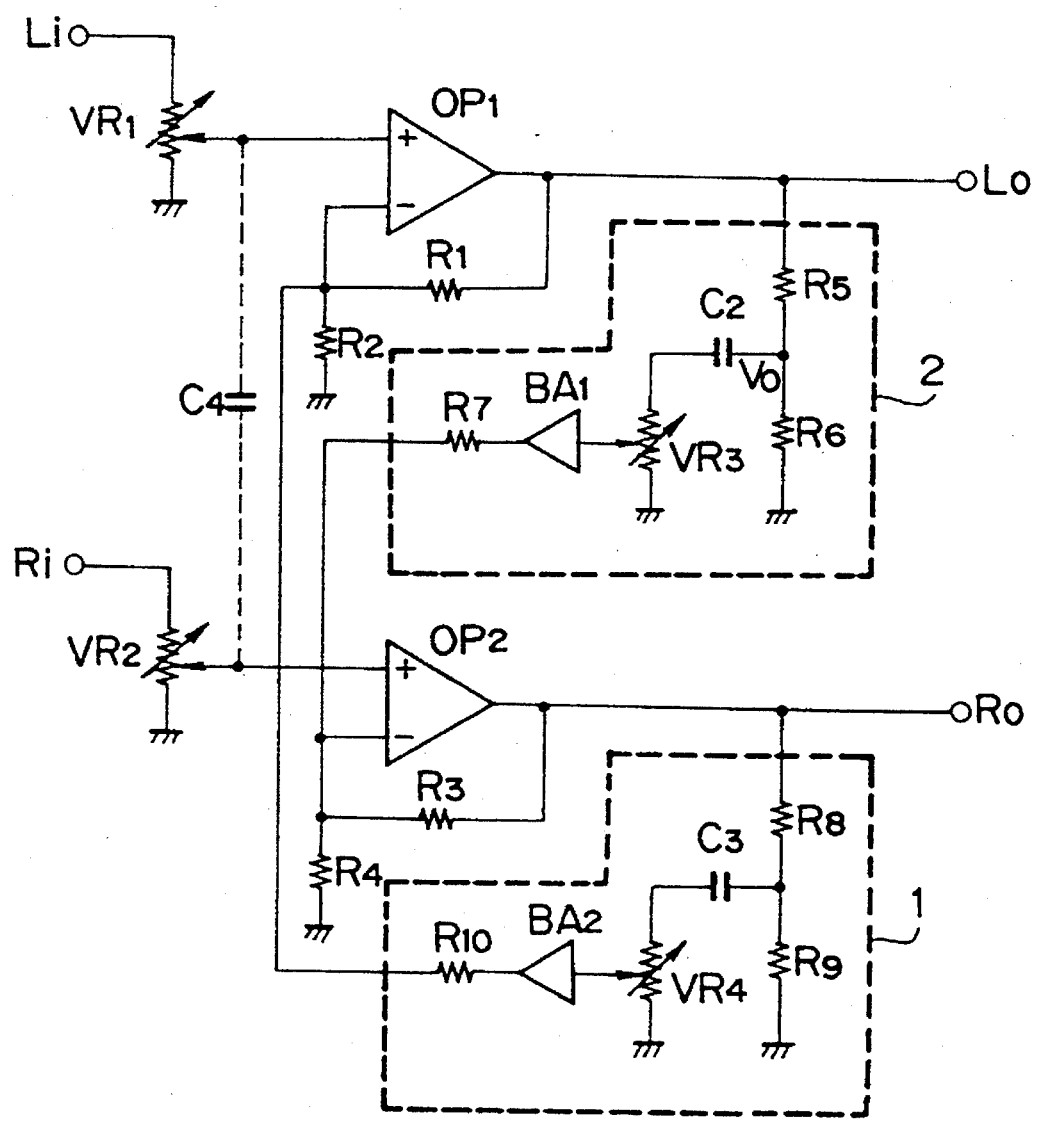
FIG. 1 is a circuit of an audio amplifier having a crosstalk preventing circuit according to the present invention.

Referring to FIG. 1, the audio amplifier comprises an opamp OP1 for the L-channel and an opamp OP2 for the R-channel.

The non-inverting terminal of the opamp OP1 is connected to the input terminal Li for the L-channel through a variable resistor VR1. The inverting terminal of the opamp OP1 is connected to the gain setting resistors R1 and R2 and to a crosstalk cancelling circuit 1 for generating a cancellation signal.

The non-inverting terminal of the opamp OP2 is connected to the input terminal Ri for the R-channel through a variable resistor VR2. The inverting terminal of the opamp OP2 is connected to the gain setting resistors R3 and R4 and to a crosstalk cancelling circuit 2 for generating another cancellation signal.

The crosstalk cancelling circuit 1 comprises resistors R8, R9 for dividing the output voltage of the opamp OP2, a capacitor C3 passing an alternating current component, a buffer amplifier BA2 for preventing the change of characteristic with respect to the opamp OP1, a variable resistor VR4 for automatically changing the gain of the buffer amplifier BA2 in accordance with the change of the resistance of the variable resistor VR2, and a resistor R10 for restricting the current.

The crosstalk cancelling circuit 2 comprises resistors R5, R6 for dividing the output voltage of the opamp OP1, a capacitor C2 passing an alternating current component, a buffer amplifier BA1 for preventing the change of characteristic with respect to the opamp OP2, a variable resistor VR3 for changing the gain of the buffer amplifier BA1 corresponding to the resistance of the variable resistor VR1, and a resistor R7 for restricting the current.

In each crosstalk cancelling circuit 2(1), the resistance R1(R3) is set to be equal to the resistance R5(R8) and the resistance R2(R4) is set to be equal to resistance R6(R9), so that the output voltage of the circuit 2(1), that is the voltage of the cancellation signal CS becomes equal to the quotient of the division of the output voltage LV of the opamp OP1 by the gain G of the opamp, expressed as follows.

$$CS = LV/G$$

In other words, the level of the cancellation signal is 1/G of the output voltage. Furthermore, the capacitance C2(C3) is set to a value equal to a stray capacitance C4.

In operation, the L-channel signal input from the input terminal Li is amplified by the opamp OP1 and output from the output terminal Lo. Similarly, the R-channel signal is amplified by the opamp OP2 and output from the output terminal Ro. The output of the opamp OP1 is fed to the crosstalk cancelling circuit 2. In the circuit 2, the output LV is reduced to the value equal to the quotient divided by the gain (LV/G) which is regulated by the capacitor C2, variable resistor VR3 and applied to the inverting terminal of the opamp OP2 as the cancellation signal.

On the other hand, the output of the opamp OP2 is fed to the crosstalk cancelling circuit 1. In the circuit 1, the output LV is reduced to the value equal to the quotient divided by the gain (LV/G) which is regulated by the capacitor C3, variable resistor VR4 and applied to the inverting terminal of the opamp OP1 as the cancellation signal. The cancellation signal is a high frequency signal corresponding to the crosstalk signal.

The cancellation signal is applied to the opposite input of the opposite channel opamp of the audio amplifier. Thus, the crosstalk signal is cancelled by the cancellation signal, so that the desired signal is output from each output terminal.

Figure 2:
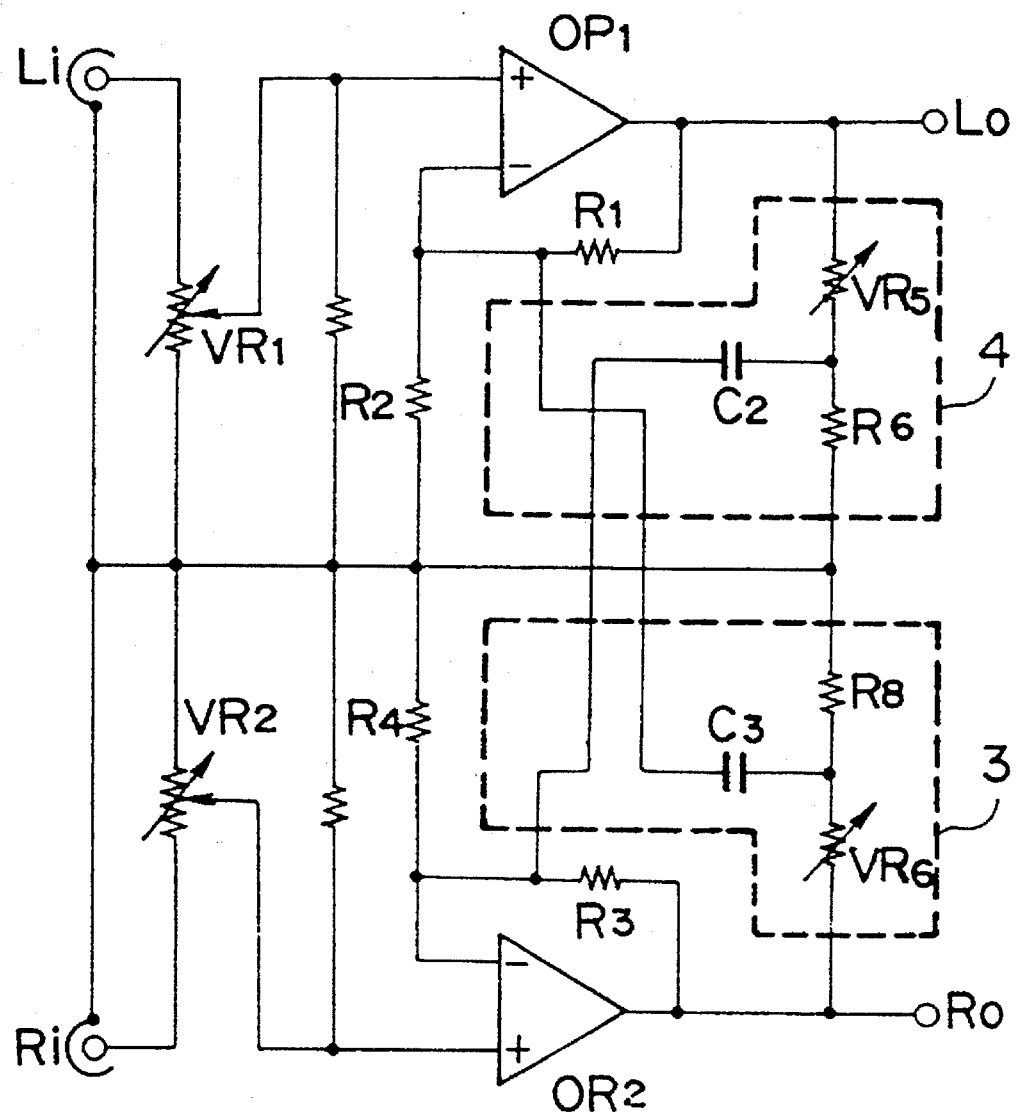
FIG. 2 is a circuit showing a second embodiment of the present invention.

FIG. 2 shows the second embodiment of the present invention where the same parts as the first embodiment are identified with the same reference numerals as in FIG. 1.

The non-inverting terminal of the opamp OP1 for the L-channel is connected to the input terminal Li through the variable resistor VR1. The inverting terminal of the opamp OP1 is connected to the gain setting resistors R1 and R2 and to a crosstalk cancelling circuit 3 comprising an attenuator for generating a first cancellation signal.

The non-inverting terminal of the opamp OP2 for the R-channel is connected to the input terminal Ri through the variable resistor VR2. The inverting terminal of the opamp OP2 is connected to the gain setting resistors R3 and R4 and to a crosstalk cancelling circuit 4 comprising an attenuator for generating a second cancellation signal.

The crosstalk cancelling circuit 3 comprises the variable resistor VR6 and the resistor R8 for dividing the output voltage of the opamp OP2, and capacitor C3. The resistance of the variable resistor VR6 changes corresponding to the resistance of the variable resistor VR2.

The crosstalk cancelling circuit 4 comprises the variable resistor VR5, the resistor R6 for dividing the output voltage of the opamp OP1, and the capacitor C2. The resistance of the variable resistor VR5 corresponds to the resistance of the variable resistor VR1.

In operation, the L-channel signal input from the input terminal Li is amplified by the opamp OP1 and output from the output terminal Lo. Similarly, the R-channel signal is amplified by the opamp OP2 and output from the output terminal Ro. The output of the opamp OP1 is fed to the crosstalk cancelling circuit 4. In the circuit 4, the output LV is attenuated by resistors VR5, R6 to a predetermined level and applied to the inverting terminal of the opamp OP2 as the cancellation signal.

On the other hand, the output of the opamp OP2 is fed to the crosstalk cancelling circuit 3. In the circuit 3, the output LV is attenuating by resistors VR6 and R8 to a predetermined value equal to the quotient divided by level, and applied to the inverting terminal of the opamp OP1 as the cancellation signal.

In the second embodiment, each crosstalk cancelling circuit comprises an attenuator, thereby omitting the buffer amplifier. Accordingly, the circuit is simplified in construction and made at a low cost compared with the first embodiment.

Figure 3:
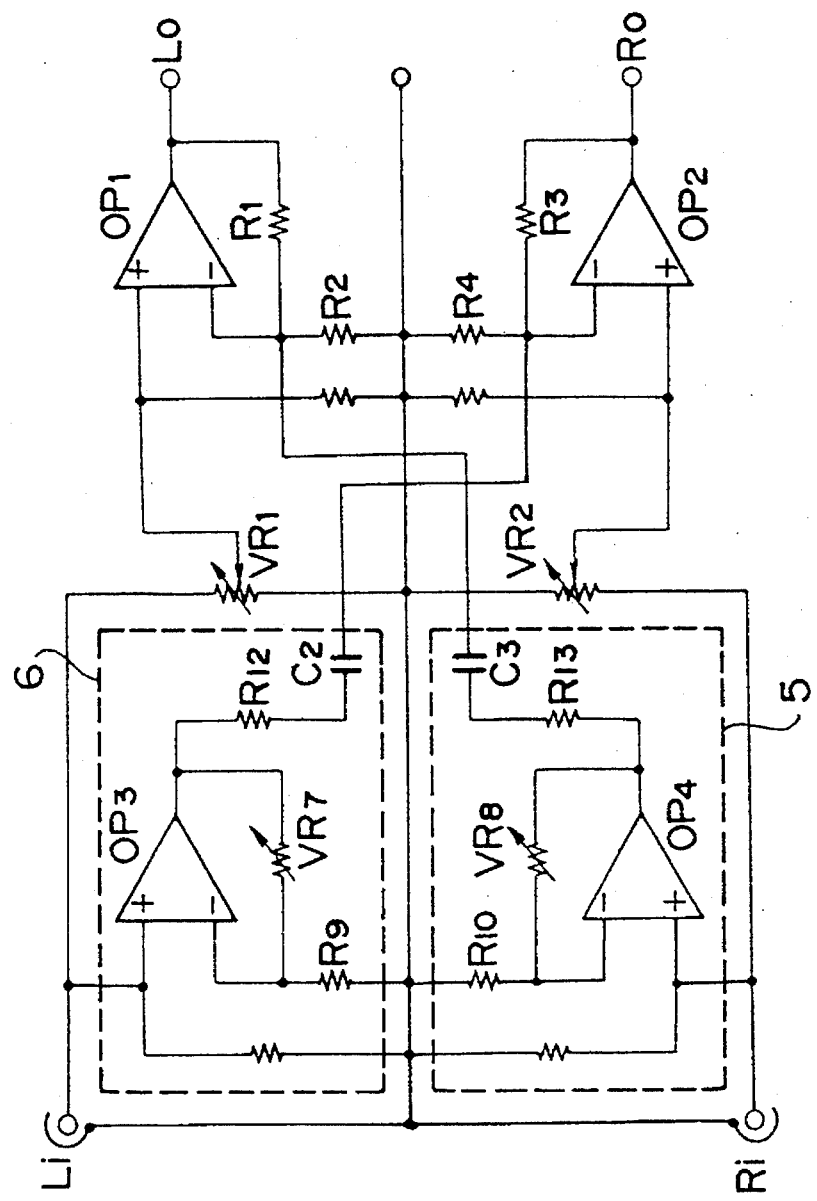
FIG. 3 is a circuit showing a third embodiment of the present invention.

Referring to FIG. 3 showing the third embodiment, the non-inverting terminal of the opamp OP1 is connected to the input terminal Li through the variable resistor VR1. The inverting terminal of the opamp OP1 is connected to the gain setting resistors R1 and R2 and to a crosstalk cancelling circuit 5.

The non-inverting terminal of the opamp OP2 for the R-channel is connected to the input terminal Ri through the variable resistor VR2. The inverting terminal of the opamp OP2 is connected to the gain setting resistors R3 and R4 and to a crosstalk cancelling circuit 6.

The crosstalk cancelling circuit 5 comprises an opamp OP4 having a gain setting resistor R10 and a variable resistor VR8 corresponding to the variable resistor VR2, a current restricting resistor R13, and the capacitor C3. The non-inverting terminal of the opamp OP4 is connected to the input terminal Ri.

The crosstalk cancelling circuit 6 comprises an opamp OP3 having a gain setting resistor R9 and a variable resistor VR7 corresponding to the variable resistor VR1, a current resisting resistor R12, and the capacitor C2. The non-inverting terminal of the opamp OP3 is connected to the input terminal Li.

In operation, the L-channel signal input from the input terminal Li is amplified by the opamp OP1 and output from the output terminal Lo. Similarly, the R-channel signal is amplified by the opamp OP2 and output from the output terminal Ro. Furthermore, the input signal from the terminal Li is applied to the opamp OP3 of the crosstalk cancelling circuit 6.

On the other hand, the input signal from the terminal Ri is applied to the opamp OP4 of the crosstalk cancelling circuit 5.

The opamp OP3 of the crosstalk cancelling circuit 6 amplifies the L-channel input signal to a predetermined level which is applied to the inverting terminal of the opamp OP2 through the resistor R12 and the capacitor C2.

Furthermore, the opamp OP4 amplifies the R-channel input signal to a predetermined level which is applied to the inverting terminal of the opamp OP1 through the resistor R13 and the capacitor C3.

Thus, L-channel and R-channel signals are converted to the cancellation signals by the opamps OP3 and OP4 without being amplified by the audio amplifiers OP1 and OP2.

Figure 4:
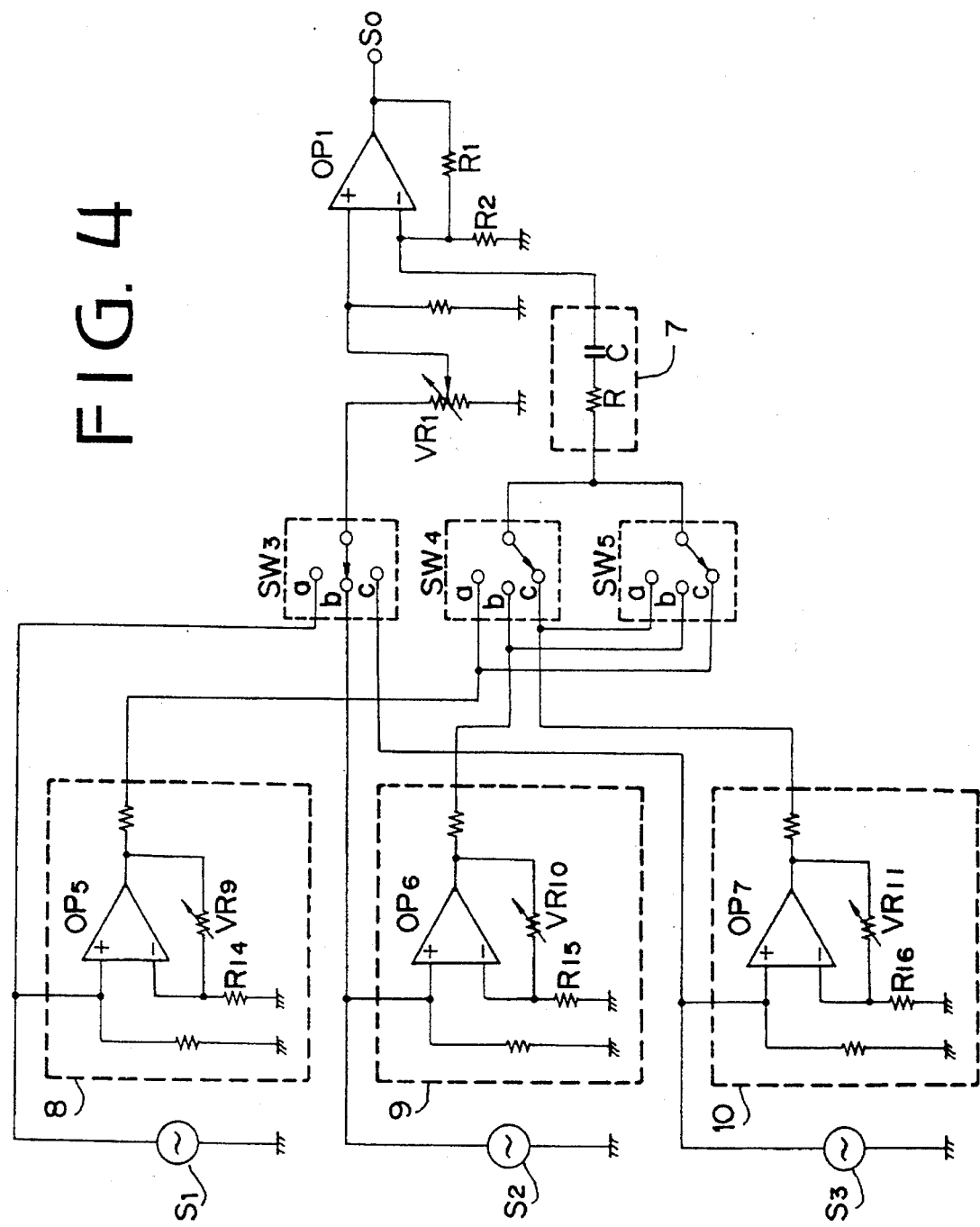
FIG. 4 shows a fourth embodiment of the present invention.
Figure 5:
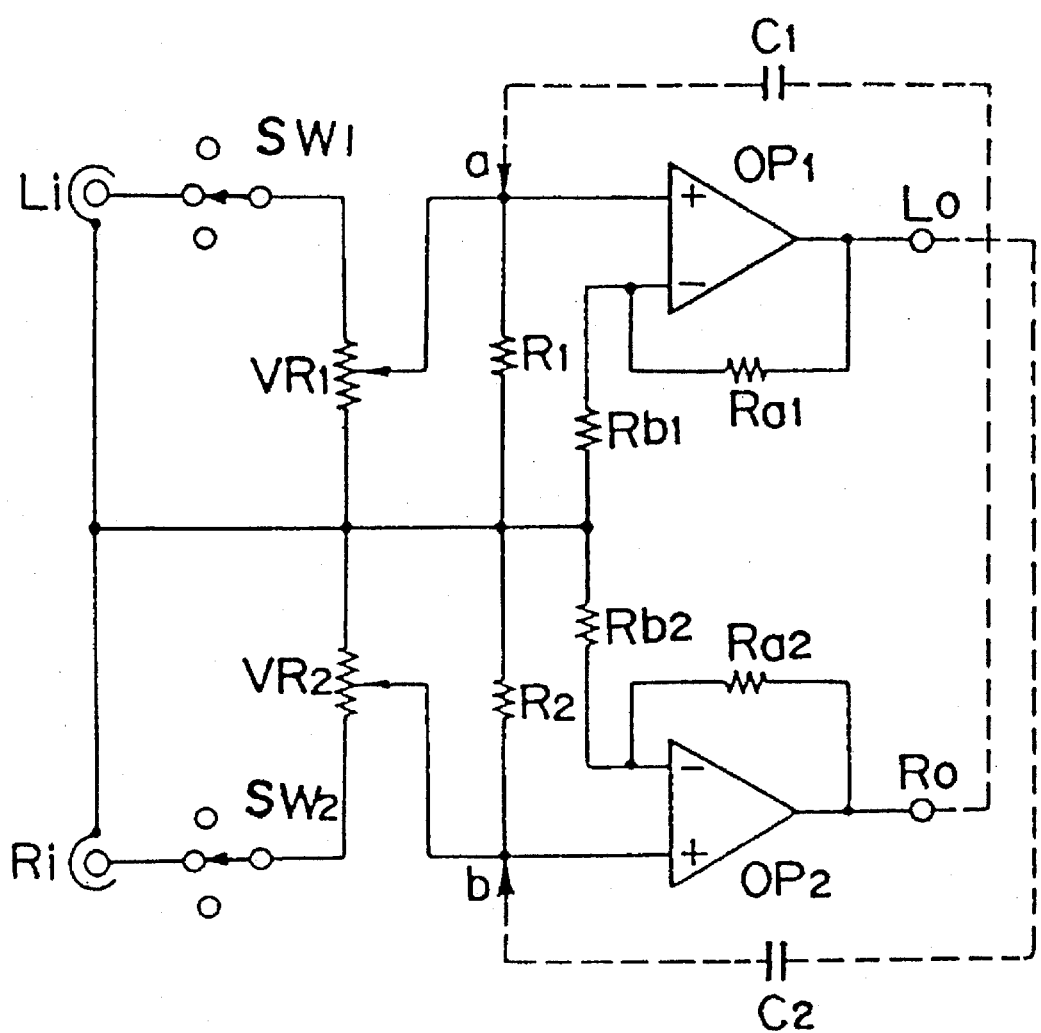
FIG. 5 is a circuit showing a conventional audio amplifier.

Referring to FIG. 4 showing the fourth embodiment, the non-inverting terminal of the opamp OP1 is selectively connected to one of three signal sources S1 to S3 through the variable resistor VR1 and a select switch SW3. The gain setting resistors R1 and R2, and a filter 7 comprising a resistor R and a capacitor C are connected to the inverting terminal of the opamp OP1. The inverting terminal of the opamp Op1 is selectively connected to one of three crosstalk cancelling circuits 8 to 10 through select switches SW4 and SW5 and the filter 7. The select switches SW4 and SW5 are automatically operated in accordance with operation of the select switch SW3.

The crosstalk cancelling circuits 8, 9, 10 comprises opamps OP5, OP6 and OP7 having gain setting resistors R14, R15, R16 and variable resistors VR9, VR10, VR11, respectively. The resistance of each variable resistor is automatically changed with the change of the resistance of the variable resistor VR1. The opamps OP5 to OP7 amplify the source signal from the sources S1 to S3 to produce cancellation signals, respectively.

When a terminal b of the select switch SW3 is selected, terminals c of the select switches SW4 and SW5 are automatically selected. Thus, the source signal from the source S2 is applied to the non-inverting terminal of the opamp OP1 through the variable resistor VR1, and the cancellation signals from the crosstalk cancelling circuits 8 and 10 are applied to the inverting terminal through the filter 7. When a terminal a or c of the switch SW3 is selected, a terminal b or a of the switch SW4 and a terminal a or b of the switch SW5 are selected.

In the fourth embodiment, the cancellation signal is obtained from a source which is not selected for the audio amplifier. Consequently, the crosstalk caused by a stray capacity generating between the non-inverting terminal of the audio opamp and the select switch can be prevented.

Although, the present invention is described about audio amplifiers, the present invention can be applied to other circuits such as a video amplifier.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A crosstalk preventing circuit for preventing crosstalk between electronic signals from adjacent electronic circuits of an audio amplifier, comprising:

first and second input terminal means for receiving a first electronic signal and a second electronic signal respectively;

a first operational amplifier having a first input terminal and a second input terminal, the first input terminal being connected to said first input terminal means;

a second operational amplifier having a first input terminal and a second input terminal, the first input terminal thereof being connected to said second input terminal means;

a first crosstalk cancelling circuit having an input connected to an output terminal of said first operational amplifier and having an output connected to said second input terminal of said second operational amplifier, the first crosstalk cancelling circuit including attenuator means, connected between said input and said output, for attenuating an output of the first operational amplifier to a predetermined value, said attenuator means adjusted to cancel crosstalk caused by stray coupling from said output of the first operational amplifier to the first input terminal of the second operational amplifier; and a second crosstalk cancelling circuit having an input connected to an output terminal of said second operational amplifier and having an output connected to the second input terminal of said first operational amplifier, the second crosstalk cancelling circuit including attenuator means, connected between said input and said output, for attenuating an output of the second operational amplifier to a predetermined value, said second crosstalk cancelling circuit attenuator means adjusted to cancel crosstalk caused by stray coupling from an output of the second operational amplifier to the first input terminal of the first operational amplifier.

2. A crosstalk preventing circuit as claimed in claim 1, wherein the attenuator means of said first crosstalk cancelling circuit includes signal dividing means connected to receive an output of the first operational amplifier for dividing the output thereof, a buffer amplifier connected to the signal dividing means for preventing a change in characteristic of a divided output of the first operational amplifier relative to the first operational amplifier and a variable gain setting means connected between the signal dividing means and the buffer amplifier for setting a gain level of the buffer amplifier, and the attenuator means of said second crosstalk cancelling circuit includes signal dividing means connected to receive an output of the second operational amplifier for dividing the output thereof, a buffer amplifier connected to the signal dividing means for preventing a change in characteristic of a divided output of the second operational amplifier relative to the second operational amplifier and a variable gain setting means connected between the signal dividing means and the buffer amplifier for setting a gain level of the buffer amplifier.

3. The circuit according to claim 1 wherein said crosstalk is caused by a stray capacity between the output of each of the operational amplifiers and the input terminal of the opposite operational amplifier.

4. A crosstalk preventing circuit for preventing crosstalk between electronic signals from adjacent electronic circuits of an audio amplifier, comprising:

first and second input terminal means for receiving a first electronic signal and a second electronic signal respectively;

a first operational amplifier having a first input terminal and a second input terminal, the first input terminal being connected to said first input terminal means;

a second operational amplifier having a first input terminal and a second input terminal, the first input terminal thereof being connected to said second input terminal means;

a first crosstalk cancelling circuit provided between the first input terminal means and said second input terminal of said second operational amplifier, the first crosstalk cancelling circuit including attenuator means for attenuating an input from the first input terminal means to a predetermined value, said attenuator means adjusted to cancel crosstalk caused by stray coupling from said output of the first operational amplifier to the first input terminal of the second operational amplifier; and a second crosstalk cancelling circuit provided between the second input terminal means and the second input terminal of said first operational amplifier, the second crosstalk cancelling circuit including attenuator means for attenuating an input from the second input terminal means to a predetermined value, said second crosstalk cancelling circuit attenuator means adjusted to cancel crosstalk caused by stray coupling from an output of the second operational amplifier to the first input terminal of the first operational amplifier.

5. A crosstalk preventing circuit as claimed in claim 4, wherein the attenuator means of said first crosstalk cancelling circuit includes amplifier means having a gain setting resistor and variable resistor, a current restricting resistor and a capacitor, and the attenuator means of said second crosstalk cancelling circuit includes amplifier means having a gain setting resistor and variable resistor, a current restricting resistor and a capacitor.

6. A crosstalk preventing circuit comprising:

a plurality of signal sources;

a plurality of crosstalk cancelling circuits for amplifying input signals from said signal sources respectively;

an operational amplifier having a first input terminal and a second input terminal; and a plurality of select switches for selecting one of said signal sources as an input signal for said first terminal and for selecting one of said crosstalk cancelling circuits connected to another signal source other than said one selected signal source.

* * * * *